United States Patent
Wu

(10) Patent No.: US 11,722,149 B2
(45) Date of Patent: Aug. 8, 2023

(54) DEFLATE COMPRESSION USING SUB-LITERALS FOR REDUCED COMPLEXITY HUFFMAN CODING

(71) Applicant: Beijing Tenafe Electronic Technology Co., Ltd., Beijing (CN)

(72) Inventor: Yingquan Wu, Palo Alto, CA (US)

(73) Assignee: Beijing Tenafe Electronic Technology Co., Ltd.

(*) Notice: Subject to any disclaimer, the term of this patent is extended or adjusted under 35 U.S.C. 154(b) by 0 days.

(21) Appl. No.: 17/899,993

(22) Filed: Aug. 31, 2022

(65) Prior Publication Data
US 2022/0416811 A1 Dec. 29, 2022

Related U.S. Application Data

(63) Continuation of application No. 17/350,706, filed on Jun. 17, 2021, now Pat. No. 11,469,773.

(51) Int. Cl.
| | |
|---|---|
| *H03M 7/42* | (2006.01) |
| *H03M 7/30* | (2006.01) |
| *H03M 7/46* | (2006.01) |
| *H03M 7/40* | (2006.01) |

(52) U.S. Cl.
CPC ......... *H03M 7/42* (2013.01); *H03M 7/3086* (2013.01); *H03M 7/405* (2013.01); *H03M 7/46* (2013.01); *H03M 7/6005* (2013.01)

(58) Field of Classification Search
CPC ......... H03M 7/42; H03M 7/405; H03M 7/46; H03M 7/6005

USPC ........................................ 341/51, 65, 67, 87
See application file for complete search history.

(56) References Cited

U.S. PATENT DOCUMENTS

| | | | | |
|---|---|---|---|---|
| 7,492,290 B1 * | 2/2009 | Schneider | ........... | H03M 7/3086 341/87 |
| 8,125,357 B1 * | 2/2012 | Hamlet | ............... | H03M 7/4043 341/51 |

OTHER PUBLICATIONS

P. Deutsch, Deflate Compressed Data Format Specification version 1.3l, May 1996.

(Continued)

*Primary Examiner* — Khai M Nguyen
(74) *Attorney, Agent, or Firm* — Van Pelt, Yi & James LLP

(57) ABSTRACT

An input sequence that has a plurality of bits is received where the input sequence is associated with a first section of data within a compressed block. The plurality of bits in the input sequence are divided into a first sub-sequence comprising a first set of bits and a second sub-sequence comprising a second set of bits. The first sub-sequence is encoded using a first Huffman code tree to obtain a first codeword and the second sub-sequence is encoded using a second Huffman code tree to obtain a second codeword. Encoded data that includes information associated with the first Huffman code tree, information associated with the second Huffman code tree, the first codeword, and the second codeword is output.

20 Claims, 14 Drawing Sheets

(56) References Cited

OTHER PUBLICATIONS

David A. Huffman, "A Method for the Construction of Minimum-Redundancy Codes", Proceedings of the I.R.E., Sep. 1952.
Deflate Wikipedia page, downloaded from <https://en.wikipedia.org/w/index.php?title=Deflate> on Apr. 26, 2021.
Reza Hashemian, "Condensed Table of Huffman Coding, a New Approach to Efficient Decoding", from IEEE Transactions on Communications, vol. 52, No. 1, Jan. 2004.
Ziv et al., "A Universal Algorithm for Sequential Data Compression", IEEE Transactions on Information Theory, vol. IT-23, No. 3, May 1977.

* cited by examiner

Dynamic Weight Table for Huffman Code Tree A

| HCTA Symbol | Meaning |
|---|---|
| HCTA(0) | Literal: ASCII 0 |
| HCTA(1) | Literal: ASCII 1 |
| ⋮ | ⋮ |
| HCTA(254) | Literal: ASCII 254 |
| HCTA(255) | Literal: ASCII 255 |
| HCTA(256) | End of Block |
| HCTA(257) | Length L0 = 3 |
| HCTA(258) | Length L1 = 4 |
| ⋮ | ⋮ |
| HCTA(284) | 227 ≤ Length L27 ≤ 257 |
| HCTA(285) | Length L28 = 258 |

400 — literals block
402 — End of Block
404 — lengths block
410 — HCTA(257)
412 — HCTA(258)
414 — HCTA(284)
416 — HCTA(285)

Prior Art

FIG. 4

Dynamic Weight Table for Huffman Code Tree 1

| HCT1 Symbol | Meaning |
|---|---|
| HCT1(0) | Sub-literal 1: 000 |
| HCT1(1) | Sub-literal 1: 001 |
| ⋮ | ⋮ |
| HCT1(6) | Sub-literal 1: 110 |
| HCT1(7) | Sub-literal 1: 111 |
| HCT1(8) | Length: 3 |
| HCT1(9) | Length: 4 |
| ⋮ | ⋮ |
| HCT1(28) | Length: 23 |
| HCT1(29) | Length: 24 |
| HCT1(30) | End of Block |

700 brackets rows HCT1(0)–HCT1(7)
702 brackets rows HCT1(8)–HCT1(29)
704 points to HCT1(30)

FIG. 7

Dynamic Weight Table for Huffman Code Tree 2

| HCT2 Symbol | Meaning |
|---|---|
| HCT2(0) | Sub-literal 2: 00000 | ⟵ 800
| HCT2(1) | Sub-literal 2: 00001 | ⟵ 802
| ⋮ | ⋮ |
| HCT2(30) | Sub-literal 2: 11110 | ⟵ 804
| HCT2(31) | Sub-literal 2: 11111 | ⟵ 806

FIG. 8

Dynamic Weight Table for Huffman Code Tree 3

| HCT3 Symbol | Meaning |
|---|---|
| HCT3(0) | Distance: 3 |
| HCT3(1) | Distance: 4 |
| ⋮ | ⋮ |
| HCT3(20) | Distance: 23 |
| HCT3(21) | Distance: 24 |

900 (top row group), 902 (bottom row)

FIG. 9

DEFLATE COMPRESSION USING SUB-LITERALS FOR REDUCED COMPLEXITY HUFFMAN CODING

CROSS REFERENCE TO OTHER APPLICATIONS

This application is a continuation of U.S. patent application Ser. No. 17/350,706 entitled DEFLATE COMPRESSION USING SUB-LITERALS FOR REDUCED COMPLEXITY HUFFMAN CODING filed Jun. 17, 2021 which is incorporated herein by reference for all purposes.

BACKGROUND OF THE INVENTION

The DEFLATE file format is commonly used in a variety of protocols and file formats (such as ZIP, gzip, Hypertext Transfer Protocol (HTTP), etc.) and compresses data using Huffman encoding as well as other encoding techniques (e.g., LZ77). Huffman encoding is a variable-length coding technique where a code table is built or otherwise constructed so that more commonly occurring symbols are encoded as shorter codewords and less commonly occurring codewords are encoded as longer codewords. It would be desirable if new Huffman coding techniques that are less complex, require less hardware, and/or reduce the latency (i.e., processing time) were developed.

BRIEF DESCRIPTION OF THE DRAWINGS

Various embodiments of the invention are disclosed in the following detailed description and the accompanying drawings.

FIG. 4 is a diagram illustrating an example of a typical dynamic weight table associated with literals, lengths, and an end of block.

FIG. 7 is a diagram illustrating an embodiment of a dynamically generated weight table associated with first sub-literals, lengths, and an end of block.

FIG. 8 is a diagram illustrating an embodiment of a weight table associated with second sub-literals.

FIG. 9 is a diagram illustrating an embodiment of a dynamic weight table associated with distances.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a new Huffman coding technique that may be used in a DEFLATE or similar file format are described herein. First, an encoding embodiment of the technique is described where bits in a literal element (e.g., an ASCII character) are divided up into a first sub-literal (e.g., comprising a first set of bits from the literal element) and a second sub-literal (e.g., comprising the remaining bits from the literal element); the two sub-literals are then encoded using respective Huffman code trees. Then, a corresponding exemplary decoding process is described. As will be described in more detail below, this may be faster (e.g., at both the encoder and the decoder) and/or less complex (e.g., at the encoder, when constructing the Huffman code trees used to encode the sub-literals).

Figure 1:
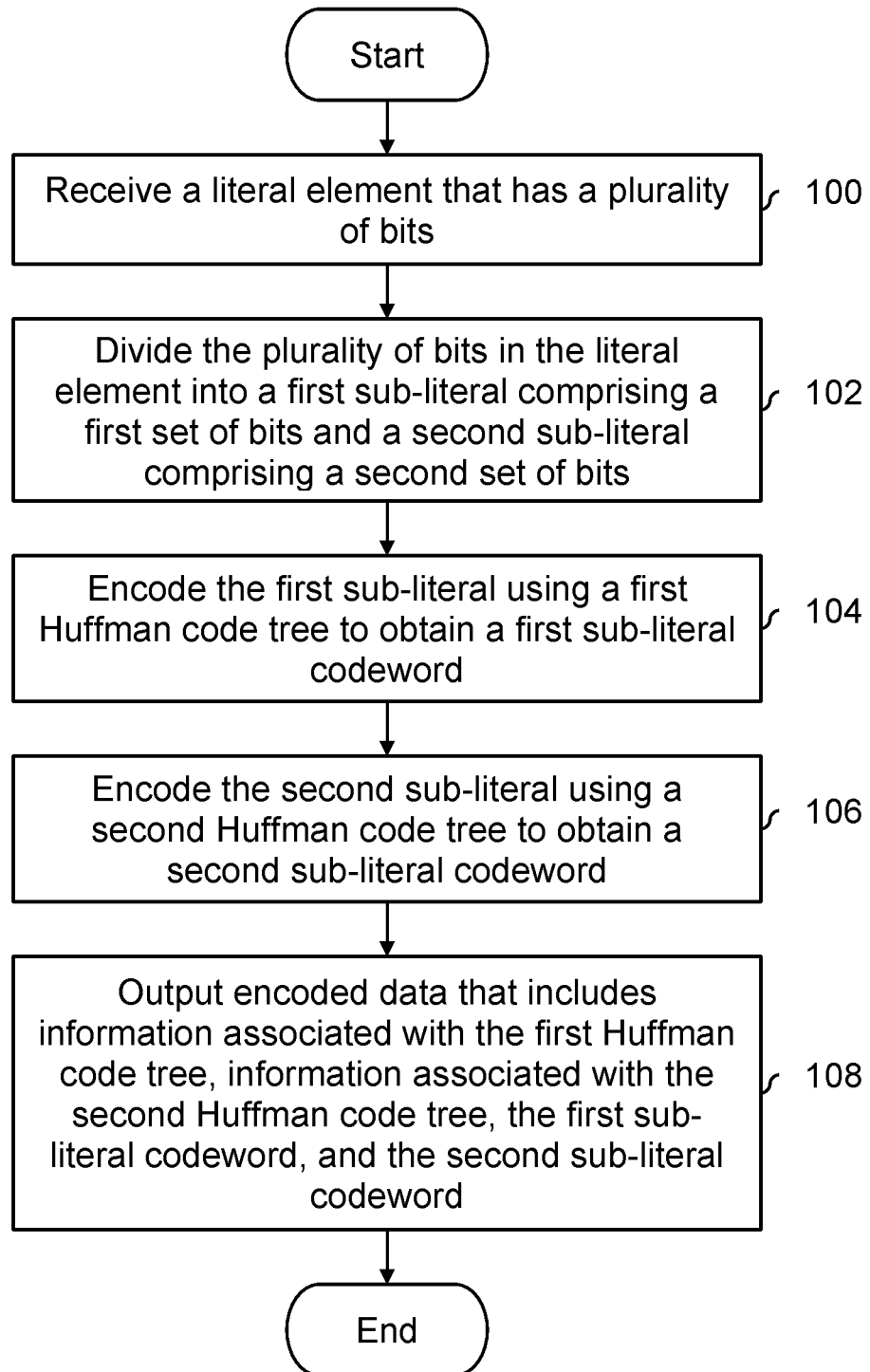
FIG. 1 is a flowchart illustrating an embodiment of an encoding process that compresses data, including by dividing literal elements into sub-literals.

FIG. 1 is a flowchart illustrating an embodiment of an encoding process that compresses data, including by dividing literal elements into sub-literals. In some embodiments, the exemplary process is performed by an encoder implemented in hardware, such as an application-specific integrated circuit (ASIC) or a field-programmable gate array (FPGA). In some embodiments, the exemplary process is performed by an encoder implemented in software, such as a computer program product embodied in a non-transitory computer readable medium and comprising computer instructions.

At 100, a literal element that has a plurality of bits is received. For example, suppose the encoder receives input data to encode. With the DEFLATE file format, one encoding paradigm is to LZ77 encode a given sequence of data (e.g., within the input data to encode) by referencing an earlier-occurring copy of that sequence of data. However, this technique will not work for the first section or chunk of data to be processed since there is nothing that precedes that first section or chunk of data. As such, a first section or chunk of data (e.g., within the input data) is encoded as a literal element (e.g., as an ASCII character or symbol) which does not reference an earlier occurring copy of a repeated sequence. Literal elements may also be used if no earlier-occurring copy is located or otherwise identified.

At 102, the plurality of bits in the literal element is divided into a first sub-literal comprising a first set of bits and a second sub-literal comprising a second set of bits. In some examples described below, a literal element has 8 bits and the 3 most significant bits form the first sub-literal and the 5 least significant bits form the second sub-literal. It is noted that this division is merely exemplary, and as will be described in more detail below, some bit divisions at step 102 may offer better performance and/or advantages than other bit divisions.

At 104, the first sub-literal is encoded using a first Huffman code tree to obtain a first sub-literal codeword. At 106, the second sub-literal is encoded using a second Huffman code tree to obtain a second sub-literal codeword. As will be described in more detail below, in some embodiments, the first Huffman code tree is also used to encode lengths (e.g., associated with an LZ77 length and backwards distance pair) and/or other characters or symbols (e.g., an end-of symbol).

At 108, encoded data that includes information associated with the first Huffman code tree, information associated with the second Huffman code tree, the first sub-literal codeword, and the second sub-literal codeword is output. For example, a header or beginning portion of a DEFLATE block or message includes information associated with the first Huffman code tree and the second Huffman code tree which permits a decoder to know how to decode the compressed data that is included in the body or latter portion of a DEFLATE block. The compressed data that is included in the body of a DEFLATE block may in turn include the first sub-literal codeword and the second sub-literal codeword. Some examples are described in more detail below.

In some applications, the encoded (i.e., compressed) data is stored in a storage system or transmitted over some communication channel. For example, by compressing data before storage, the amount of available storage may be increased. Likewise, if data is compressed before it is exchanged over some communication channel, then the consumed bandwidth and/or transmission time may be reduced.

Figure 2:
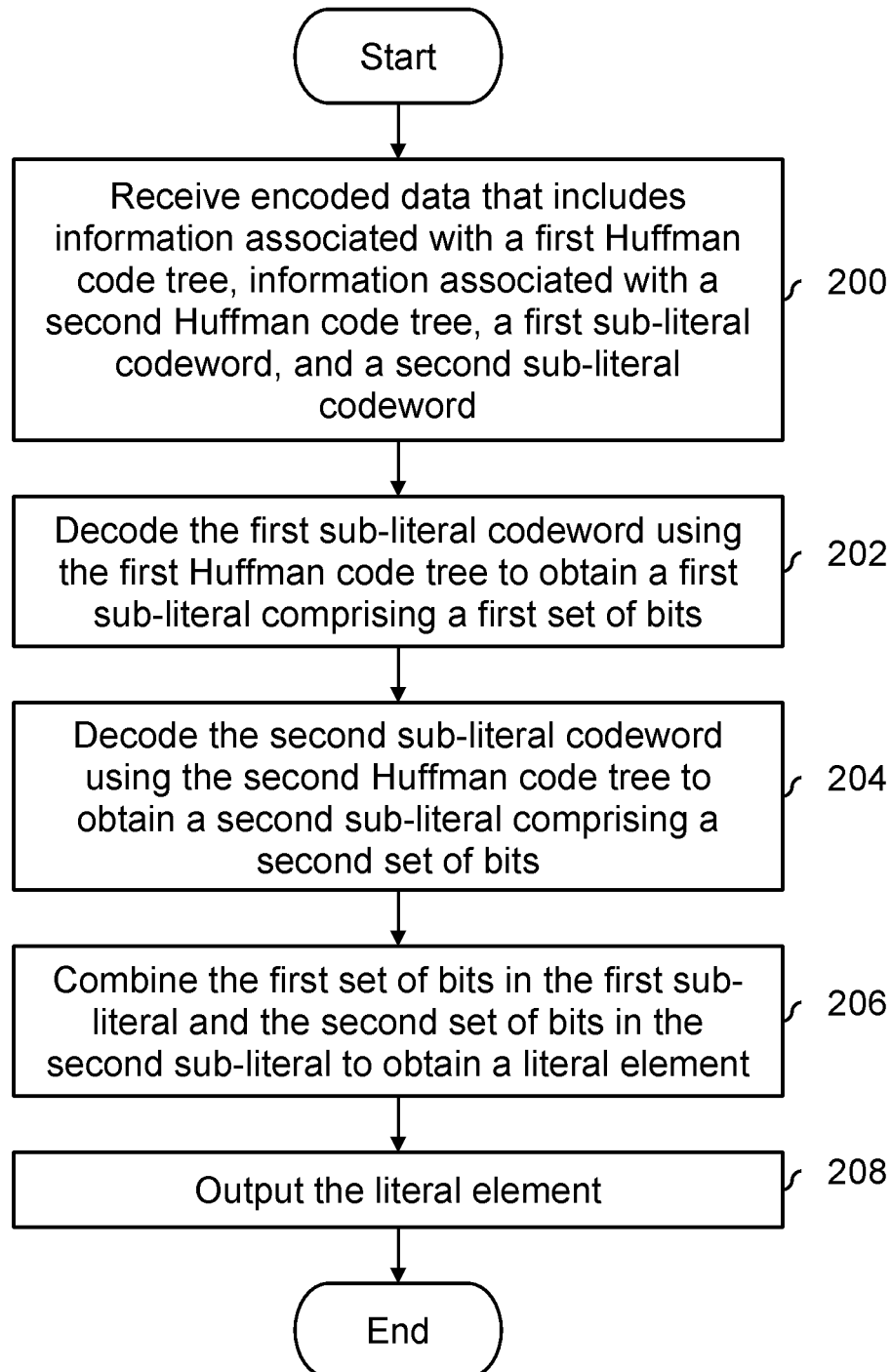
FIG. 2 is a flowchart illustrating an embodiment of a decompression and/or decoding process that combines sub-literals into literals.

FIG. 2 is a flowchart illustrating an embodiment of a decompression and/or decoding process that combines sub-literals into literals. For example, the decoding process of FIG. 2 may be used to decode data that is encoded using the process of FIG. 1. Similar to above, the exemplary decoding process may be implemented in a variety of ways, such as hardware or software.

At 200, encoded data that includes information associated with a first Huffman code tree, information associated with a second Huffman code tree, a first sub-literal codeword, and a second sub-literal codeword is received. For example, each DEFLATE packet may use different Huffman code trees (e.g., to improve the overall compression rate) and the information associated with the first Huffman code tree and the second Huffman code tree lets the decoder know how to decode the compressed data in the body of a DEFLATE packet.

At 202, the first sub-literal codeword is decoded using the first Huffman code tree to obtain a first sub-literal comprising a first set of bits. At 204, the second sub-literal codeword is decoded using the second Huffman code tree to obtain a second sub-literal comprising a second set of bits.

At 206, the first set of bits in the first sub-literal and the second set of bits in the second sub-literal are combined to obtain a literal element. For example, if the first set of bits comprises the most (least) significant bits of the literal element and the second set of bits comprises the least (most) significant bits of the literal element, then the two sets of bits may be concatenated together.

At 208, the literal element is output. For example, there may be some higher-level application or user that is waiting for the data to be decoded and/or decompressed.

To better and/or more clearly illustrate the Huffman coding technique(s) described herein and their associated benefits, it may be helpful to first illustrate a typical Huffman code tree in a typical DEFLATE block, which is more complex and/or slower than (for example) the Huffman coding techniques described in FIGS. 1 and 2. The following figures describe an example of a more complex and/or slower Huffman coding technique in a typical DEFLATE block.

Figure 3:
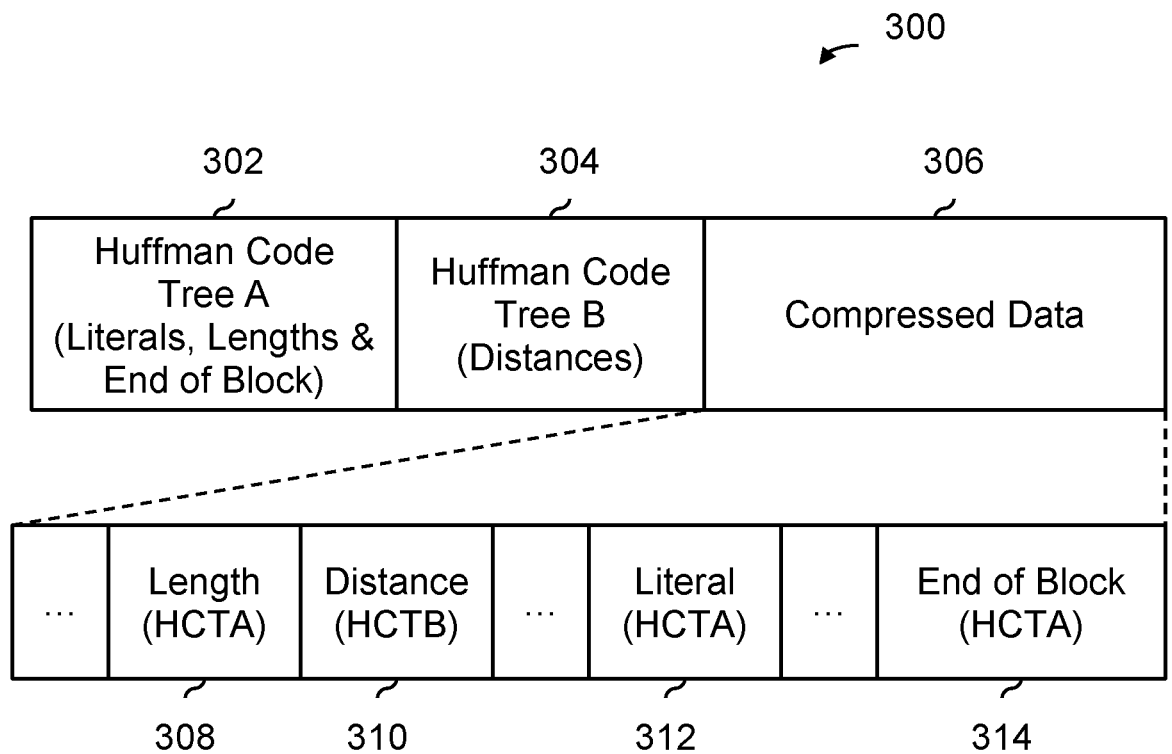
FIG. 3 is a diagram illustrating an example of a typical DEFLATE block.

FIG. 3 is a diagram illustrating an example of a typical DEFLATE block. In the example shown, the DEFLATE block (300) has two general parts: (1) the Huffman code trees (302 and 304) which describe how the compressed data (306) is encoded at the encoder and which the decoder uses to decode the compressed data and (2) the compressed data (306). In some applications, there may be a stream or sequence of DEFLATE blocks and each DEFLATE block is encoded using a different set of Huffman code trees if desired (e.g., if the different DEFLATE blocks contain different symbols and/or have different frequencies of occurrence then the compression rate may be improved by using different Huffman code trees that are optimized for each DEFLATE block).

The compressed data (306) includes a sequence of elements, one of which is a pointer element comprising a length element (308) and a distance element (310). Conceptually, a pointer element is a reference to and/or copy of an earlier occurrence of a repeated pattern or sequence and is represented by a length and (backwards) distance pair (e.g., length element (308) and distance element (310)). For context, DEFLATE (also) uses LZ77 coding and this reference to an earlier copy using a length and (backwards) distance pair comes from LZ77. For convenience and brevity, the term "distance" is understood to mean a backward distance as used herein.

In contrast with a pointer element, a literal element (312) is memoryless and does not require storing previous symbols, bytes, etc. In examples described herein, literal elements include ASCII symbols or values.

The third element in the compressed data (306) in this example is the end of block element (314). The end of block is a special symbol that indicates the end of the compressed data (306), and therefore also the end of the DEFLATE block (300).

Each of the Huffman code trees (302 and 304) is associated with and/or used to encode a different element or part of an element. The Huffman code tree A (302) is associated with literals, lengths, and end of block and therefore the length (308), literal element (312), and end of block element (314) are encoded using that code tree. Huffman code tree B (304) is associated with distances and so the distance element (310) is encoded using that Huffman code tree.

Conceptually, each of the Huffman code trees (302 and 304) may be thought of as consisting of two separate parts: a dynamic weight table and its corresponding codeword tree, which varies for each DEFLATE block. The following figures describe examples of a dynamically produced weight table and its corresponding codeword tree associated with Huffman code tree A (302).

FIG. 4 is a diagram illustrating an example of a typical dynamic weight table associated with literals, lengths, and an end of block. For example, Huffman code tree A (302) in FIG. 3 may use the exemplary dynamic weight table shown here. In some embodiments, a dynamic weight table includes other entries in addition to and/or as an alternative to the entries shown here.

In this example, Huffman code tree A (HCTA) symbols HCTA(0) through HCTA(255) are associated with and/or used to represent the literals ASCII 0 through ASCII 255, respectively, as is shown in the first set of rows (400).

Per row 402, the Huffman code tree A symbol HCTA(256) is used to represent the end of block symbol. For example, this symbol is used for the end of block element (314) in FIG. 3.

Per the last set of rows (404) in the table, the Huffman code tree A symbols HCTA(257) through HCTA(285) are used to represent (e.g., configurable) lengths L0 through L28, each of which is a length between 3 and 258. For example, the values of L0 through L28 are set to values that occur in and/or are used by the particular length-distance pairs that occur in a given DEFLATE block. As a result of the dynamic nature of the lengths, the table is referred to as a dynamic weight table (and if desired, other mappings and/or elements in the table may also be changed dynamically from DEFLATE block to DEFLATE block). For example, HCTA(257) corresponds to a length (L0) of 3 (see row 410), HCTA(258) corresponds to a length (L1) of 4 (see row 412), HCTA(284) corresponds to a length (L27) between 227 and 257, inclusive (see row 414), and HCTA(285) corresponds to a length (L28) of 258 (see row 416).

The Huffman code tree A symbols shown in this table (i.e., HCTA(0)-HCTA(285)) are (Huffman) encoded using a codeword tree of maximum length 15. The following figure shows an example of this.

Figure 5:
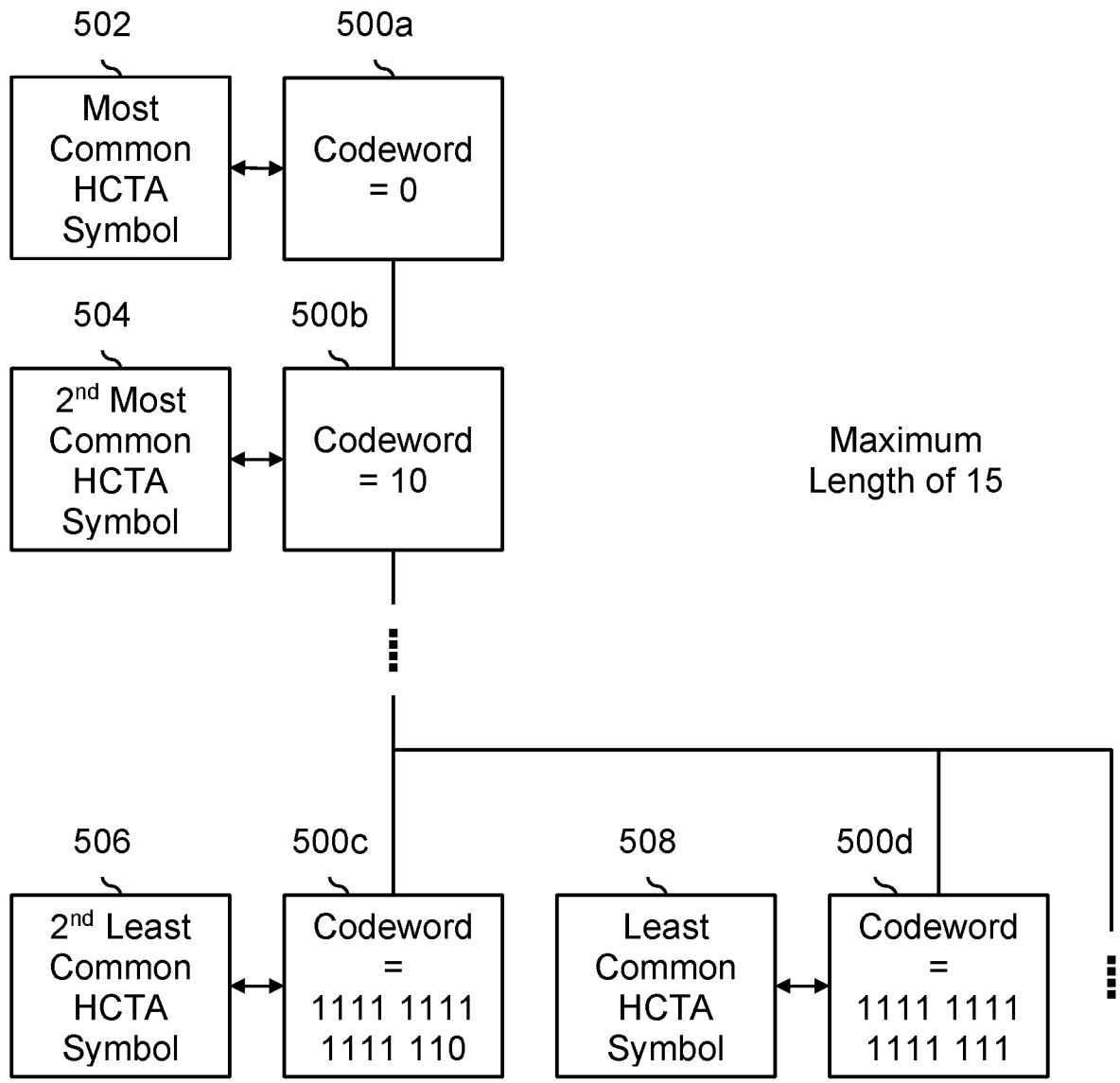
FIG. 5 is a diagram illustrating an example of a typical codeword tree associated with literals, lengths, and end of block.

FIG. 5 is a diagram illustrating an example of a typical codeword tree associated with literals, lengths, and end of block. In this example, the Huffman code tree A symbols (i.e., HCTA(0)-HCTA(285)) from FIG. 4 are Huffman encoded (i.e., mapped to codewords) depending upon their frequency of occurrence.

The most commonly used Huffman code tree A symbol (502) (e.g., with the highest frequency of occurrence in an associated DEFLATE block) is mapped to the shortest codeword (500a), in this example a codeword of length 1 with a value of 0.

The second most commonly used Huffman code tree A symbol (504) is mapped to the second shortest codeword (500b), in this example a codeword of length 2 with a value of 10.

This continues on up to the second least commonly used Huffman code tree A symbol (506) and least commonly used Huffman code tree A symbol (508) which are mapped to the longest codewords (500c and 500d) which are 15 bits long and have values of 1111 1111 1111 110 and 1111 1111 1111 111, respectively. In other words, the Huffman tree shown here has a maximum length of 15 and/or has to go through a maximum of 15 multiplexers to obtain a Huffman code tree A symbol from a codeword.

For brevity, a dynamic weight table and its codeword tree corresponding to the match distances (e.g., Huffman code tree B (304) in FIG. 3) are not shown but may be similarly constructed. In some typical DEFLATE software blocks, the match distances are limited to values between 1 and 32,768. In some such typical DEFLATE, the Huffman coding is only applied to the most significant two bits of a distance whereas the remaining bits (if any) are appended (note the given most significant two bits contain the information of the number of remaining bits). This effectively reduces the Huffman tree size to 30, instead of 32,768.

To decode a codeword, the decoder may examine the first (e.g., most significant) bit in the codeword. If that first bit is a 0, then it is shortest codeword (500a) which corresponds to the most common Huffman code tree A symbol (502). If the first bit is a 1, then the decoder will examine the next bit in the sequence and so on and so forth. As such, worst case, the decoder could go through 15 layers of multiplexers (e.g., to get to the longest codewords (500c and 500d) and least common Huffman code tree A symbols (506 and 508)).

Returning briefly to FIG. 3, the compressed data (306) includes the codewords (500a-500d) shown in the codeword tree of FIG. 5. Huffman code tree A (302) at the beginning of the DEFLATE block (300) contains the dynamic weight table shown in FIG. 4 and the codeword tree shown in FIG. 5 (or equivalent information) which the decoder uses to decode the codewords contained in the compressed data (306).

It is noted that once a Huffman code tree A symbol is determined (e.g., per FIG. 5), it is not a straightforward matter to determine the appropriate literal (see, e.g., rows 400 in FIG. 4) or other symbol (see, e.g., rows 402 and 404 in FIG. 4). This is because the dynamic weight table shown in FIG. 4 is itself Huffman encoded. For the size of the dynamic weight table shown in FIG. 4 (i.e., with 286 entries), the decoding path goes through 9 layers of multiplexers to identify the appropriate literal (or length or end of block) given the Huffman code tree A symbol.

Consider a data storage application that uses the hardware encoder and decoder to perform the typical DEFLATE described above. In such an application, the data size (e.g., the amount of data capable of being read back from storage during a single read operation) is limited to ~4K (e.g., 4,096) or ~8K (e.g., 8,192) bytes. Suppose that a single DEFLATE block corresponds to 4K of data so that each read from storage corresponds to either one or two DEFLATE blocks (e.g., depending upon whether the data size is ~4K or ~8K bytes). One drawback associated with the technique described above is that constructing a Huffman code tree for the literals (e.g., at the encoder), which includes constructing the dynamic weight table with 286 literals (see, e.g., FIG. 4) and a codeword tree with a maximum length of 15 (see, e.g., FIG. 5), requires a long latency (i.e., a long processing time) and a large degree of complexity.

On the decoder side, latency is often an important consideration (e.g., because a user and/or higher-level application is waiting for the data in a DEFLATE block). However, the critical path delay for decoding a literal element (e.g., 312 in FIG. 3) is linearly dependent on the maximum tree length and the number of literals. For the exemplary storage application described above, the critical path (for decoding literals) goes through 15 layers of multiplexers to determine the Huffman code tree A symbol from the codeword (e.g., per FIG. 5); then, a look up in the dynamic weight table to determine which literal corresponds to a given Huffman code tree A symbol (e.g., per FIG. 4) takes 9 layers of multiplexers.

In contrast, the encoding technique described in FIG. 1 (and the corresponding decoding technique described in FIG. 2) has less complexity (e.g., at the encoder when constructing the Huffman code trees) and/or faster processing times (e.g., at the encoder and/or decoder). The following embodiments describe various aspects of this technique in more detail.

Figure 6:
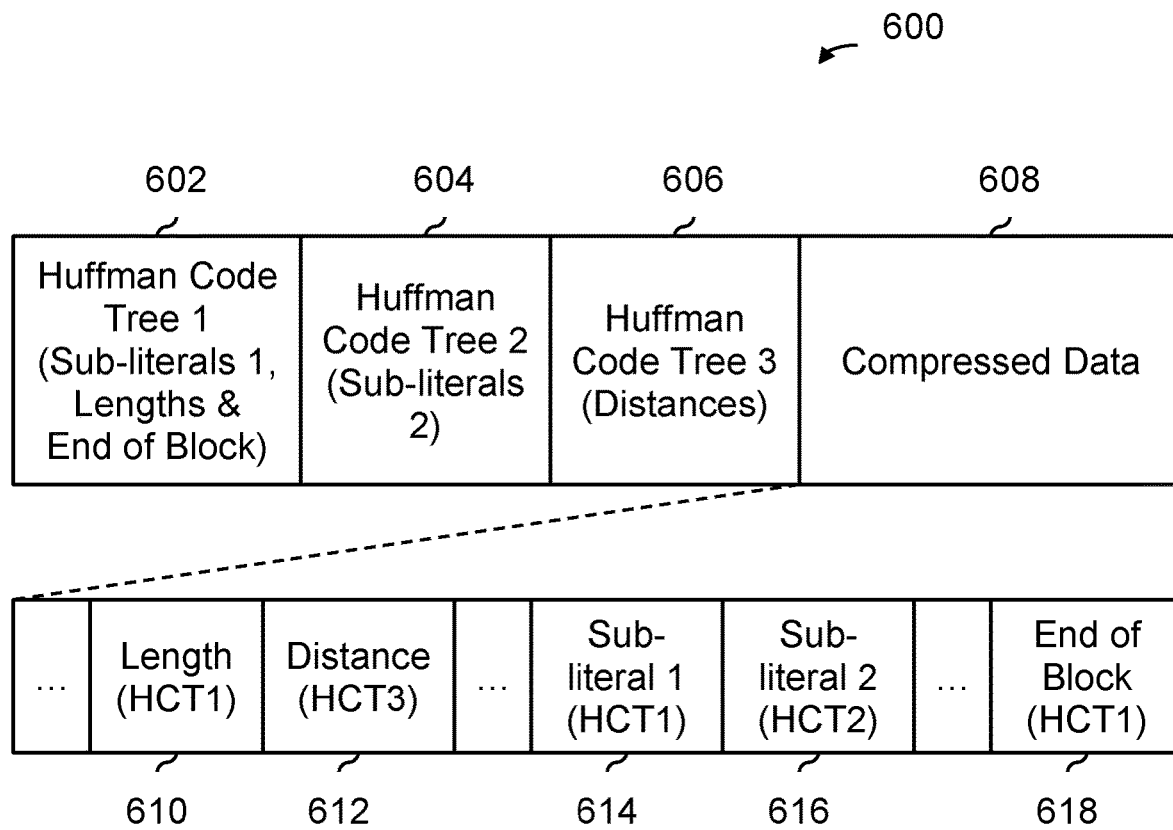
FIG. 6 is a diagram illustrating an embodiment of a DEFLATE block with sub-literal elements.

FIG. 6 is a diagram illustrating an embodiment of a DEFLATE block with sub-literal elements. In the example shown, the DEFLATE block (600) has three Huffman code trees. The first Huffman code tree (602) is associated with and/or used to encode first sub-literals, lengths, and an end of block. As such, the length element (610), first sub-literal element (614), and end of block element (618) in the compressed data (608) are encoded using the first Huffman code tree (602).

The second Huffman code tree (604) is associated with and/or used to encode second sub-literals. The second sub-literal element (616) in the compressed data (608) is therefore encoded using the second Huffman code tree (604).

The third Huffman code tree (606) is associated with and/or used to encode distances, such as the distance element (612) in the compressed data (608).

FIG. 7 is a diagram illustrating an embodiment of a dynamically generated weight table associated with first sub-literals, lengths, and an end of block. For example, the first Huffman code tree (602) in FIG. 6 may use the exemplary dynamic weight table shown here. In this example, literals are constrained, limited, or assumed to have 8 bits so that $2^8=256$ literals (e.g., 256 ASCII characters) can be represented or otherwise supported. This may be a safe assumption to make because many DEFLATE blocks may (only) contain 256 or fewer unique literals. In this example, the 3 most significant bits in a literal are associated with the first sub-literal, which this table includes. The HCT1 symbols HCT1(0) through HCT1(7) therefore are used for the first sub-literal values of 000 through 111, respectively, per the first eight rows (700). It is noted that any combination of bits may be selected for or included in the first sub-literal and it is not limited to the three most significant bits.

In this example, the (supported) lengths in LZ77 matches (i.e., length and distance pairs) are limited to be between 3 and 24. In the next set of rows (702), the HCT1 symbols HCT1(8) through HCT1(29) are used for and/or associated with lengths of 3 through 24, respectively.

It is noted that one benefit to reducing the maximum supported length from 258 (see FIG. 4) to 24 (as shown in FIG. 7) means that a smaller memory may be used in the encoder and the decoder to store previous symbols.

The last row (704) shows that the HCT1 symbol HCT1 (30) is used for the end of block element. In some embodiments, unused symbols that are not shown (e.g., HCT1(31)) are reserved.

Using a smaller number of permitted and/or supported lengths (e.g., 22 supported lengths in FIG. 7 versus 29 supported lengths in FIG. 4) enables the size of the table to be linearly reduced). Furthermore, the table is simplified because the lengths (702) in FIG. 7 are fixed values as opposed to the dynamic length values (404) in FIG. 4. As a result of the smaller table size, while the table in FIG. 4 has a maximum Huffman length of 9 (e.g., 9 layers of multi-plexers), the table in FIG. 7 has enforced a maximum Huffman length of either 8 or 9 (i.e., sometimes and/or potentially shorter).

FIG. 8 is a diagram illustrating an embodiment of a weight table associated with second sub-literals. For example, the second Huffman code tree (604) in FIG. 6 may use the exemplary dynamic weight table shown here. In this example, the 5 least significant bits from the 8 bits of literal comprise a second sub-literal. As shown in the first row (800), second Huffman code tree symbol HCT2(0) is used to represent the second sub-literal of 00000. The second Huffman code tree symbol HCT2(1) is used to represent the second sub-literal of 00001 as shown in the second row (802) and so on through second Huffman code tree symbols HCT2(30) and HCT2(31) which correspond respectively to second sub-literals of 11110 and 11111 as shown in the last two rows (804 and 806).

FIG. 9 is a diagram illustrating an embodiment of a dynamic weight table associated with distances. For example, the third Huffman code tree (606) in FIG. 6 may use the exemplary dynamic weight table shown here. In this example, there are 22 supported distances ranging from a distance of 3 (see, e.g., the first row (900)) to a distance of 24 (see, e.g., the last row (902)).

Figure 10:
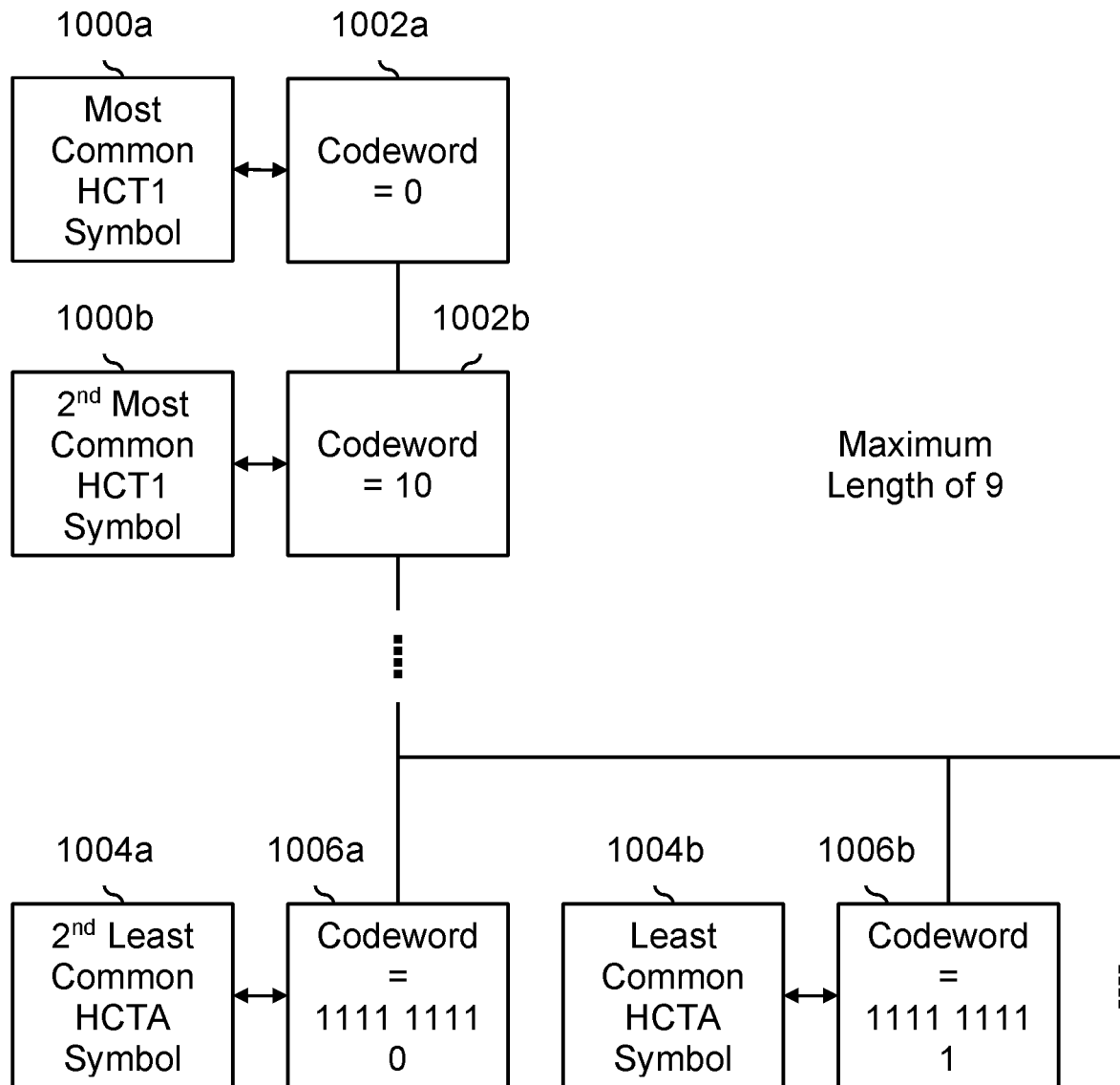
FIG. 10 is a diagram illustrating an embodiment of a codeword tree associated with first sub-literals, lengths, and an end of block.

FIG. 10 is a diagram illustrating an embodiment of a codeword tree associated with first sub-literals, lengths, and an end of block. In this example, the first Huffman code tree symbols (i.e., HCT1(0)-HCT1(30)) from FIG. 7 are Huffman encoded as shown here. The two most common first Huffman code tree symbols (1000a and 1000b) are assigned to the two shortest codewords (1002a and 1002b). The two least common first Huffman code tree symbols (1004a and 1004b) are assigned to the two longest codewords (1006a and 1006b) with lengths of 9 bits. This exemplary codeword tree, which has 31 first Huffman code tree symbols or codewords, has a maximum Huffman length of 9.

For brevity, a codeword tree (e.g., similar to FIG. 10) is not shown for the second Huffman code tree (see FIG. 8) nor is one shown for the third Huffman code tree (see FIG. 9) since they are similar to examples described above.

By splitting the exemplary 8 bits of literals into two sub-literals and then combining one of the sub-literals with fewer supported lengths, much smaller Huffman code trees can be built for the sub-literals as described above. Using two smaller Huffman code trees for the sub-literals (e.g., as opposed to a single, larger Huffman code tree for all of the literals) reduces the complexity associated with building the two smaller Huffman code trees and the latency associated with traversing and/or decoding using the two smaller Huffman code trees. For example, the overhead of the two smaller trees is 63×4=252 bits due to 63 codes each with 4 bits, whereas the overhead of the original tree is 286×4=1, 144 bits due to the 286 codes, each expressed in 4 bits. Although the compression ratio may be slightly degraded, in some applications this is an acceptable tradeoff for reduced complexity and/or reduced latency (e.g., real-time applications where a user is waiting for the decoded data or storage-rich applications where a slightly degraded compression ratio is acceptable).

As shown in the examples above, in some encoding (decoding) embodiments, the encoded data passes through (e.g., is stored in or read back from) a storage system with a data size that is a multiple of 4,096 bytes (e.g., 4,096 bytes, 8,192 bytes, etc.) and the first Huffman code tree is further associated with a set of supported lengths having 22 supported lengths (see, e.g., FIG. 7).

As shown in the examples above, in some encoding (decoding) embodiments, the encoded data passes through a storage system with a data size that is a multiple of 4,096 bytes and the first Huffman code tree is further associated with a set of supported lengths having a maximum supported length of 24 (see, e.g., FIG. 7).

As shown in the examples above, in some encoding (decoding) embodiments, the encoded data passes through a storage system with a data size that is a multiple of 4,096 bytes, the first set of bits in the first sub-literal has three bits (see, e.g., FIG. 7), and the second set of bits in the second sub-literal has five bits (see, e.g., FIG. 8).

Figure 11:
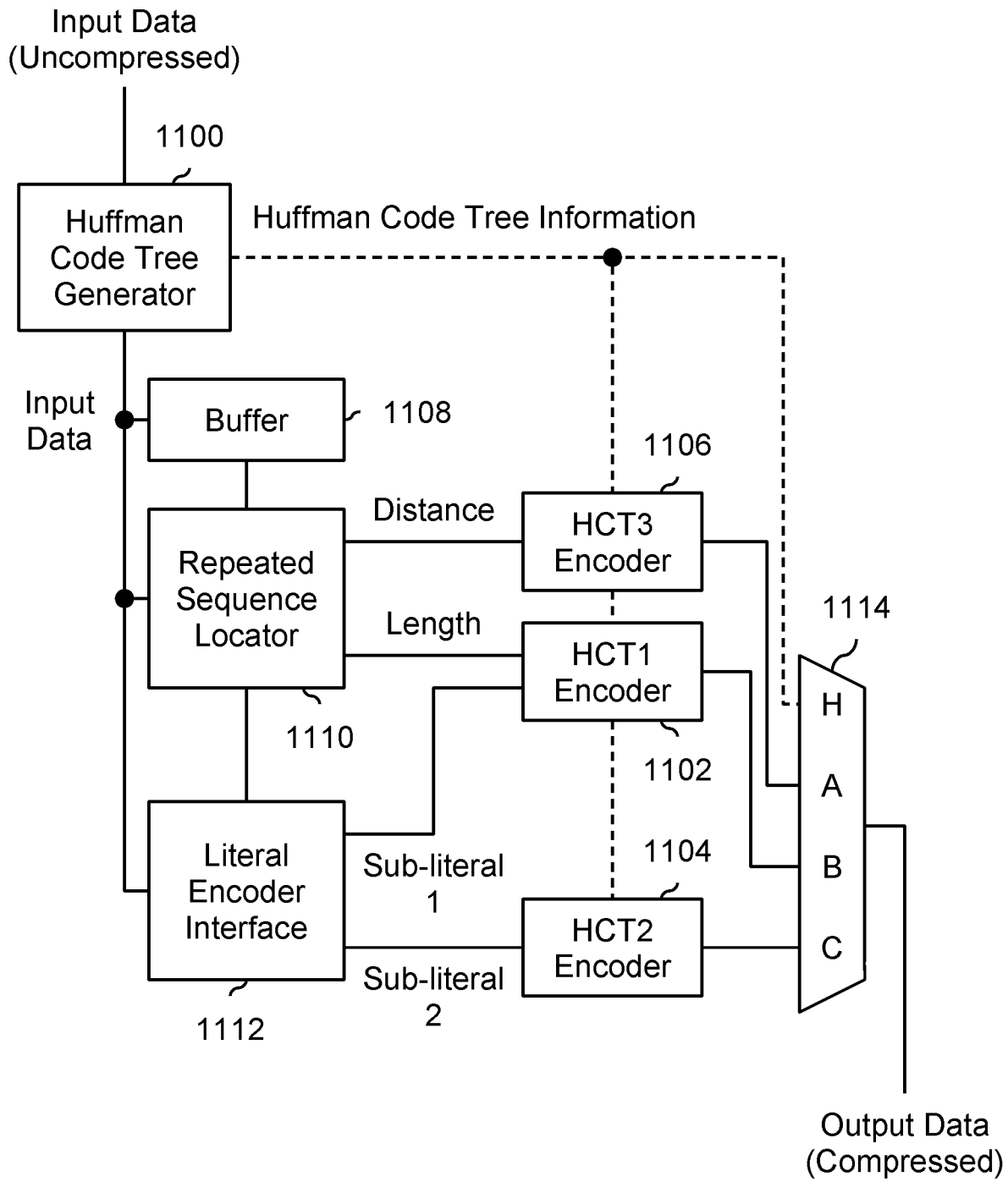
FIG. 11 is a diagram illustrating an embodiment of a DEFLATE encoder that divides literals into sub-literals.

FIG. 11 is a diagram illustrating an embodiment of a DEFLATE encoder that divides literals into sub-literals. In the example shown, input (uncompressed) data is first analyzed by a Huffman code tree generator (1100) which generates three Huffman code trees. The Huffman code tree information is output by the Huffman code tree generator (1100) and is passed to the first Huffman code tree (HCT1) encoder (1102), the second Huffman code tree (HCT2) encoder (1104), and the third Huffman code tree (HCT3) encoder (1106) and the appropriate code information is used to configure those encoders. To more clearly distinguish between the configuration information (e.g., Huffman code tree information) and the payload, the Huffman code tree information is shown with a dashed line.

Once the encoders are configured or otherwise set up, the input data can be encoded. In this example, LZ77 encoding is attempted first. The input data is passed to a buffer (1108). A repeated sequence locator (1110) searches for repeated sequences in the buffer (1108), for example when a given sequence is being processed and an earlier-occurring copy of that sequence is located in the buffer. If a repeated sequence is located within the buffer (1108), then the length is passed to HCT1 encoder (1102) and the distance is passed to HCT3 encoder (1106) from the repeated sequence locator (1110).

It is noted that the size of the buffer (1108) is smaller than a buffer which implements a typical DEFLATE scheme. For example, in a typical DEFLATE scheme, the supported lengths are drawn from a range of 3 to 258 and the supported distances are drawn from a range of 1 to 32,768. In contrast, with the reduced-complexity DEFLATE embodiment described above, the supported lengths are drawn from a range of 3 to 24 and the supported distances are drawn from a range of 1 to 32,768

If the repeated sequence locator (1110) is unable to locate a repeated sequence within the buffer (1108), then the repeated sequence locator (1110) communicates with the literal encoder interface (1112) so that the appropriate symbol(s) and/or byte(s) of the input data can be encoded as sub-literals. The literal encoder interface (1112) outputs a first sub-literal (i.e., sub-literal 1) to HCT1 encoder (1102) and a second sub-literal (i.e., sub-literal 2) to HCT2 encoder (1104).

The outputs of the encoders (1102, 1104, and 1106) as well as the Huffman code tree information from the Huffman code tree generator (1100) are passed to a multiplexer (1114) which selects the appropriate input at the appropriate time and outputs the output (compressed) data. For example, the output of the multiplexer (1114) may correspond to the DEFLATE block (600) shown in FIG. 6. The multiplexer (1114) may select the H input during the header portion of the DEFLATE block (e.g., Huffman code tree information (602, 604, and 606) in FIG. 6). The A input of the multiplexer (1114) may be selected when HCT1 encoder (1102) has generated a codeword (e.g., corresponding to the length element (610), the first sub-literal element (614), or the end of block element (618) in FIG. 6). The B input of the multiplexer (1114) may be selected when HCT2 encoder (1104) has generated a codeword (e.g., corresponding to the second sub-literal element (616) in FIG. 6) and the C input of the multiplexer (1114) may be selected when HCT3 encoder (1106) has generated a codeword (e.g., corresponding to the distance element (612) in FIG. 6).

In some embodiments, the exemplary encoder shown here performs the process of FIG. 1. For example, literal encoder interface (1112) may perform steps 100 and 102, HCT1 encoder (1102) may perform step 104, HCT2 encoder (1104) may perform step 106, and the multiplexer (1114) may perform step 108.

Figure 12:
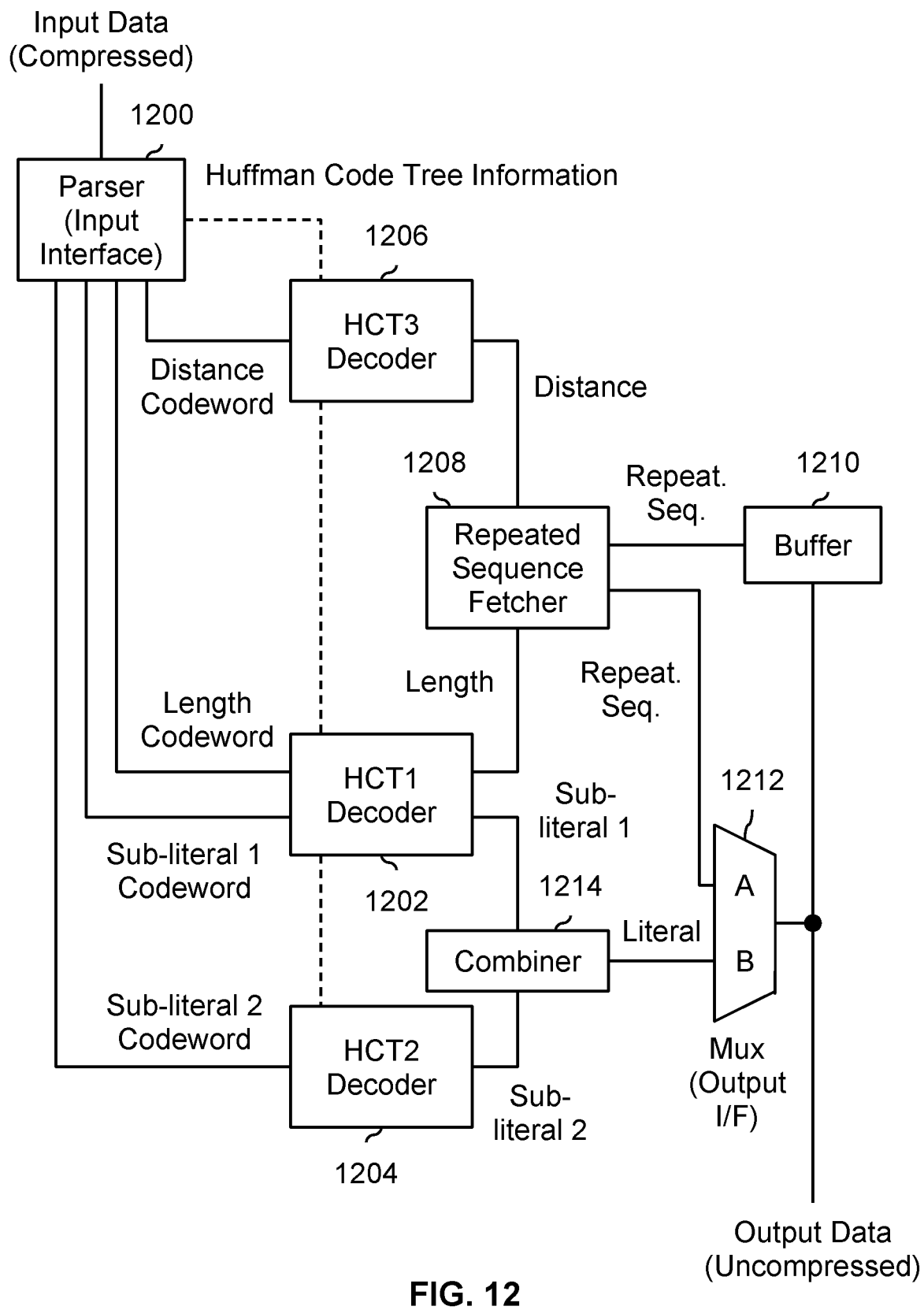
FIG. 12 is a diagram illustrating an embodiment of a DEFLATE decoder where sub-literals are combined into literals.

FIG. 12 is a diagram illustrating an embodiment of a DEFLATE decoder where sub-literals are combined into literals. In this example, the input (compressed) data is first analyzed by parser (1200) which functions as an input interface and also extracts the Huffman code tree information (e.g., in the header portions (602, 604, 606) in FIG. 6). The Huffman code tree information is then passed to the first Huffman code tree (HCT1) decoder (1202), the second Huffman code tree (HCT2) decoder (1204), and the third Huffman code tree (HCT3) decoder (1206) and the appropriate code information is used to configure those decoders.

In this example, a DEFLATE block includes identifying information (e.g., field or element identifiers) which identifies the type of element and/or codeword. These identifiers permit the parser (1200) to separate out and pass length codewords and first sub-literal codewords to the HCT1 decoder (1202), second sub-literal codewords to the HCT2 decoder (1204), and distance codewords to the HCT3 decoder (1206).

For LZ77 information, the HCT1 decoder (1202) decodes the length codeword to obtain a length and the HCT3 decoder (1206) decodes the distance codeword to obtain a distance. The length and distance are passed to a repeated sequence fetcher (1208) which accesses a buffer (1210) at the specified length and distance to obtain the repeated sequence. The repeated sequence is then passed from the repeated sequence fetcher (1208) to the A input of a multiplexer (1212) which also functions as an output interface. The buffer (1210) samples the output of the multiplexer (1212) so that all previously occurring symbols or bytes over the window of interest are available for copying.

For sub-literals, the HCT1 decoder (1202) generates a first sub-literal from a corresponding first sub-literal codeword and the HCT2 decoder (1204) generates a second sub-literal from a corresponding second sub-literal codeword. The two sub-literals are passed to a (e.g., bit) combiner (1214) which combines the two sub-literals in order to obtain a literal (e.g., in the example described above, by concatenating the two sub-literals). The literal is passed from the combiner (1214) to the B input of the multiplexer (1212). The multiplexer selects the appropriate input at the appropriate time to generate the output (uncompressed) data.

In some embodiments, the exemplary decoder shown here performs the process of FIG. 2. For example, the parser (1200) may perform step 200, the HCT1 decoder (1202) may perform step 202, the HCT2 decoder (1204) may perform step 204, the combiner (1214) may perform step 206, and the multiplexer (1212) may perform step 208.

In some embodiments, how bit division is performed (e.g., how a literal is divided into sub-literals) is simplified. In the simple example described above, the 3 most significant bits of a literal element form the first sub-literal and the 5 least significant bits form the second sub-literal. Other bit divisions may be used and if 5 out of 8 bit indexes are selected then there are $$\binom{8}{5} = \frac{8!}{3!5!} = 56$$

possible ways of dividing an 8-bit literal into a 5-bit sub-literal and 3-bit sub-literal.

If an optimized compression ratio is desired, then a Huffman code tree generator (e.g., 1100 in FIG. 11) in the encoder may collect the frequencies for each of the 56 possibilities in order to determine the best manner of dividing the bits (e.g., that optimizes the compression ratio). In some embodiments, instead of considering all 56 possibilities (as an example), only four possible ways of bit-dividing a literal into sub-literals are considered (e.g., using sample and/or representative data sets). Or, a single pre-determined division of bits is used which achieves the best average compression using sample and/or representative data sets. In some applications, this tradeoff between simplifying the complexity of the system and/or reducing latency at the expense of some compression performance is acceptable.

Another sub-task or operation where it may be desirable to simplify the complexity of the system is the construction of the codeword trees (e.g., the association of Huffman code tree symbols to codewords, one example of which is shown in FIG. 10). In some embodiments, a Huffman code tree generator (e.g., 1100 in FIG. 11) performs this task by determining or otherwise estimating the compressed size of a given stream of input data using a collected frequency set, without actually encoding the input data of interest.

For example, let $f_0, f_1, f_1, \ldots, f_{(n-1)}$ be the sequence of collected frequencies. Let $l_0, l_1, l_1, \ldots, l_{(n-1)}$ be the associated Huffman code lengths. To use FIG. 10 as an example, $l_0=1$ bit for codeword 1002a, $l_1=2$ bits for codeword 1002b, and so on and $f_0$ is the frequency of the most common first Huffman code tree symbol 1000a occurring, $f_1$ is the frequency of the second most common first Huffman code tree symbol 1000b occurring, and so on.

The overall Huffman encoded data length is given by $\Sigma_{i=0}^{n-1} f_i l_i$. For example, this value may correspond to the length of the compressed data section (608) shown in FIG. 6. In some embodiments, instead of considering all possible mappings or associations between the Huffman code tree symbols and the codewords, a Huffman code tree generator only considers a limited number of possibilities. In one example, the value of $\Sigma_{i=0}^{n-1} f_i l_i$ is evaluated for only four pre-defined mappings or associations; the pre-defined mapping or association with the lowest value is selected.

However, using the equation $\Sigma_{i=0}^{n-1} f_i l_i$ alone may still require Huffman codes to be calculated for each candidate option (e.g., each candidate way of assigning the Huffman code tree symbols to codewords per FIG. 10). To further reduce complexity, in some embodiments, the Huffman compressed data length is estimated by substituting an integer bit length $l_i$ by $-\log f_i$, using:

$$-\sum_{i=0}^{n-1} f_i \cdot \log f_i$$

which avoids building the Huffman tree.

DEFLATE encoders and decoders which perform the techniques described herein may be used in a variety of applications and/or systems. The following figures illustrate an exemplary communications application and storage application, respectively.

Figure 13:
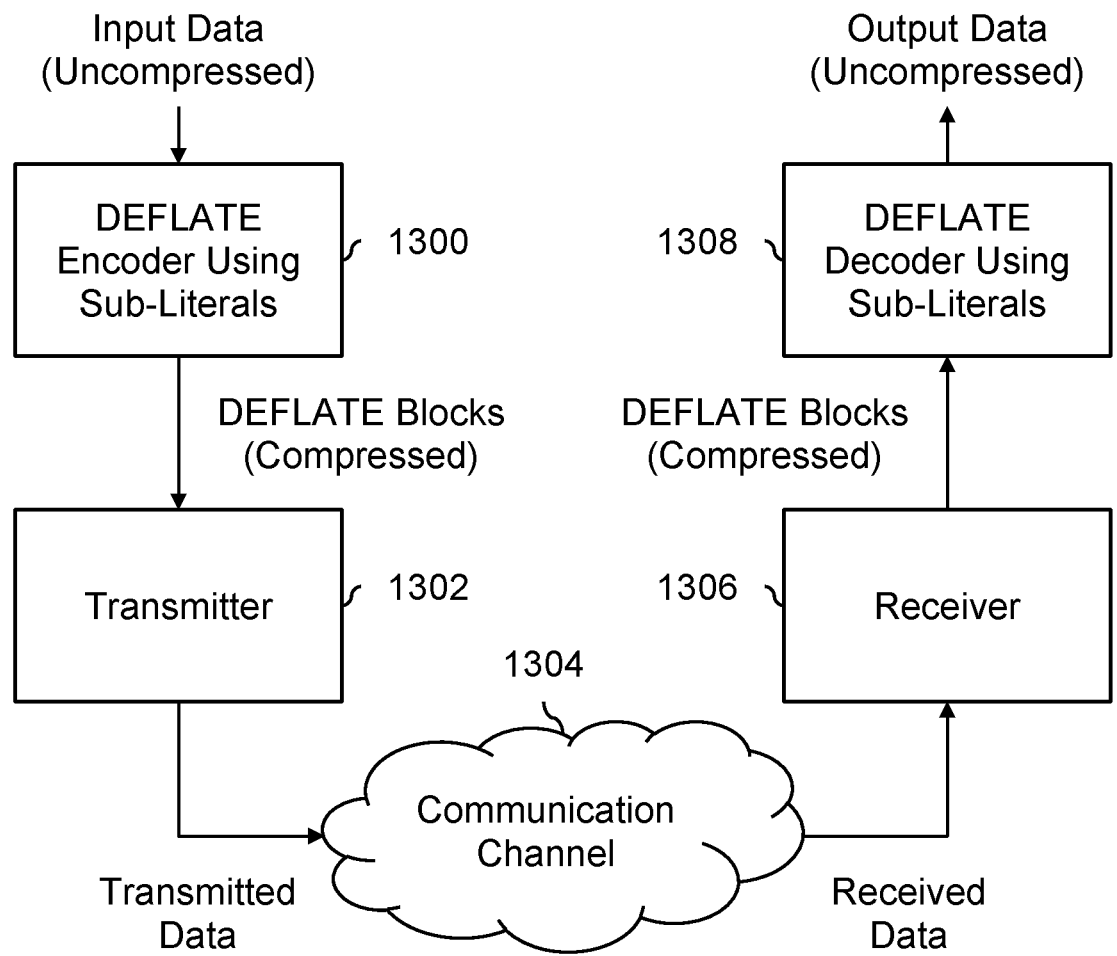
FIG. 13 is a diagram illustrating an embodiment of a DEFLATE encoder and decoder that use sub-literals in a communications application.

FIG. 13 is a diagram illustrating an embodiment of a DEFLATE encoder and decoder that use sub-literals in a communications application. In some embodiments, the DEFLATE encoder (1300) and DEFLATE decoder (1308) are implemented in hardware, such as an application-specific integrated circuit (ASIC) or a field-programmable gate array (FPGA). In this example, a DEFLATE encoder that uses sub-literals (200a) inputs (e.g., uncompressed) input data to encode and/or compress before transmission over a communications channel (1304). DEFLATE blocks (e.g., that contain the compressed input data) to transmit are passed from the DEFLATE encoder (1300) and is passed to a transmitter (1302) which modulates and/or formats the DEFLATE blocks as appropriate for the particular communication channel and sends transmitted data over a communication channel (1304), such as a wired or wireless channel and/or a network.

A receiver (1306) coupled to the communication channel (1304) inputs received data and demodulates and/or extracts the DEFLATE blocks from the received data. A DEFLATE decoder that uses sub-literals (1308) then decodes the DEFLATE blocks and outputs the (e.g., uncompressed) output data. For example, the output data may be passed to some higher-level application and/or presented or otherwise displayed to a user.

In one example, the exemplary DEFLATE encoder (1300) and DEFLATE decoder (1308) are used to exchange web-related files and/or information. A webserver may, for example, use a DEFLATE encoder (e.g., 1300) to compress webpages and/or CSS files before they are transmitted over the communication channel (1304) and the requesting device may include a DEFLATE decoder (e.g., 1308). Compressing information before it is exchanged over a communication channel permits the information to be more quickly provided to the requestor and/or receiver and also more efficiently uses the bandwidth of a communication channel.

Figure 14:
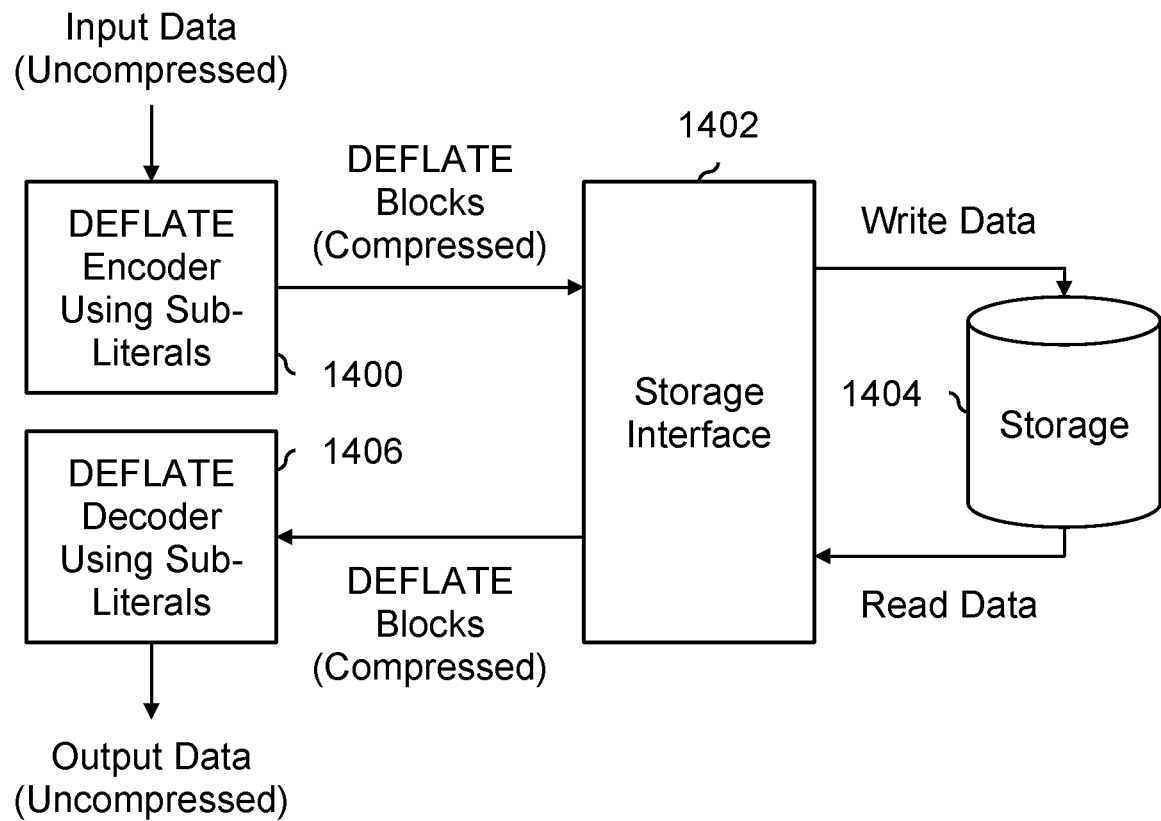
FIG. 14 is a diagram illustrating an embodiment of a DEFLATE encoder and decoder that use sub-literals in a storage application.

FIG. 14 is a diagram illustrating an embodiment of a DEFLATE encoder and decoder that use sub-literals in a storage application. In some embodiments, the DEFLATE encoder (1400) and DEFLATE decoder (1406) are implemented in hardware, such as an application-specific integrated circuit (ASIC) or a field-programmable gate array (FPGA). In this example, input data to encode is passed to a DEFLATE encoder that uses sub-literals (1400). The DEFLATE encoder (1400) passes (e.g., compressed) DEFLATE blocks to be stored and/or written to storage interface (1402) which in turn writes data to storage (1404).

To obtain the original data, the storage interface (1402) reads back data stored on the storage (1404) and passes the DEFLATE blocks to the DEFLATE decoder that use sub-literals (1406). The DEFLATE decoder (1406) decodes the DEFLATE blocks and outputs the (e.g., uncompressed) data. In some embodiments, LDPC decoder (1406) performs an early decoding termination process (e.g., FIG. 1) which permits the LDPC decoding to end earlier than some other LDPC decoders, reducing delay. For example, the output data may be passed to some higher-level application and/or presented or otherwise displayed to a user. By compressing information before it is stored, the capacity of the storage (1404) is more efficiently utilized and more useable and/or payload information may be stored thereon.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
an interface that is configured to:
receive an input sequence that has a plurality of bits, wherein the input sequence is associated with a first section of data within a compressed block; and
output encoded data that includes information associated with a first Huffman code tree, information associated with a second Huffman code tree, a first codeword, and a second codeword; and
a processor that is configured to:
divide the plurality of bits in the input sequence into a first sub-sequence comprising a first set of bits and a second sub-sequence comprising a second set of bits;
encode the first sub-sequence using the first Huffman code tree to obtain the first codeword; and
encode the second sub-sequence using the second Huffman code tree to obtain the second codeword.

2. The system recited in claim 1, wherein:
the compressed block includes a reference to an earlier occurring copy of a repeated sequence to represent a later occurring copy of the repeated sequence; and
the input sequence is associated with the first section of data within the compressed block and cannot be represented using the reference to the earlier occurring copy of the repeated sequence.

3. The system recited in claim 1, wherein the system is implemented on one or more of the following: an application-specific integrated circuit (ASIC) or a field-programmable gate array (FPGA).

4. The system recited in claim 1 further including a storage device, wherein the encoded data that includes the information associated with the first Huffman code tree, the information associated with the second Huffman code tree, the first codeword, and the second codeword is stored on the storage device.

5. The system recited in claim 1, wherein the input sequence is associated with one or more of the following a literal element or an ASCII character.

6. The system recited in claim 1, wherein the encoded data that includes the information associated with the first Huffman code tree, the information associated with the second Huffman code tree, the first codeword, and the second codeword is included in a block that follows a DEFLATE file format.

7. The system recited in claim 1, wherein the processor is further configured to encode a length using the first Huffman code tree, wherein the length is associated with a reference to an earlier occurring copy of a repeated sequence.

8. The system recited in claim 1, wherein:
the processor is further configured to encode a length using the first Huffman code tree, wherein the length is associated with a reference to an earlier occurring copy of a repeated sequence; and
the length is within a range of a minimum length of 3 and a maximum length of 24.

9. The system recited in claim 1, wherein the processor is further configured to encode a is distance using a third Huffman code tree, wherein the distance is associated with a reference to an earlier occurring copy of a repeated sequence.

10. The system recited in claim 1, wherein:
the processor is further configured to encode a distance using a third Huffman code tree, wherein the distance is associated with a reference to an earlier occurring copy of a repeated sequence; and
the distance is within a range of a minimum distance of 3 and a maximum distance of 24.

11. A method, comprising:
receiving an input sequence that has a plurality of bits, wherein the input sequence is associated with a first section of data within a compressed block;
dividing the plurality of bits in the input sequence into a first sub-sequence comprising a first set of bits and a second sub-sequence comprising a second set of bits;
encoding the first sub-sequence using a first Huffman code tree to obtain a first codeword;
encoding the second sub-sequence using a second Huffman code tree to obtain a second codeword; and
outputting encoded data that includes information associated with the first Huffman code tree, information associated with the second Huffman code tree, the first codeword, and the second codeword.

12. The method recited in claim 11, wherein:
the compressed block includes a reference to an earlier occurring copy of a repeated sequence to represent a later occurring copy of the repeated sequence; and
the input sequence is associated with the first section of data within the compressed block and cannot be represented using the reference to the earlier occurring copy of the repeated sequence.

13. The method recited in claim 11, wherein the method is performed using one or more of the following: an application-specific integrated circuit (ASIC) or a field-programmable gate array (FPGA).

14. The method recited in claim 11 further including storing the encoded data that includes is the information associated with the first Huffman code tree, the information associated with the second Huffman code tree, the first codeword, and the second codeword on a storage device.

15. The method recited in claim 11, wherein the input sequence is associated with one or more of the following a literal element or an ASCII character.

16. The method recited in claim 11, wherein the encoded data that includes the information associated with the first Huffman code tree, the information associated with the second Huffman code tree, the first codeword, and the second codeword is included in a block that follows a DEFLATE file format.

17. The method recited in claim 11, further including encoding a length using the first Huffman code tree, wherein the length is associated with a reference to an earlier occurring copy of a repeated sequence.

18. The method recited in claim 11, wherein:
the method further includes encoding a length using the first Huffman code tree, wherein the length is associated with a reference to an earlier occurring copy of a repeated sequence; and
the length is within a range of a minimum length of 3 and a maximum length of 24.

19. The method recited in claim 11, further including encoding a distance using a third Huffman code tree, wherein the distance is associated with a reference to an earlier occurring copy of a repeated sequence.

20. The method recited in claim 11, wherein:
the method further includes encoding a distance using a third Huffman code tree, wherein the distance is associated with a reference to an earlier occurring copy of a repeated sequence; and
the distance is within a range of a minimum distance of 3 and a maximum distance of 24.

\* \* \* \* \*